United States Patent [19]

Terada et al.

[11] Patent Number: 4,775,950

[45] Date of Patent: Oct. 4, 1988

[54] LOGIC SIMULATION SYSTEM

[75] Inventors: Hiroaki Terada, Suita; Katsuhiko Asada, Amagasaki; Hiroaki Nishikawa, Suita; Shuji Hara, Osaka; Mitsuo Meichi, Itami; Toshiya Okamoto, Nara; Hajime Asano, Toyonaka, all of Japan

[73] Assignee: Mitsubishi Denki Kabushiki Kaisha, Osaka, Japan

[21] Appl. No.: 793,258

[22] Filed: Oct. 31, 1985

[30] Foreign Application Priority Data

Nov. 2, 1984 [JP] Japan .............................. 59-232783

[51] Int. Cl.$^4$ .............................................. G06G 7/48
[52] U.S. Cl. .................................... 364/578; 364/550; 364/551.01; 364/571.01
[58] Field of Search ................ 364/488–491, 364/578, 550, 551, 571; 324/73 AT

[56] References Cited

U.S. PATENT DOCUMENTS

| | | | |
|---|---|---|---|
| 4,342,093 | 7/1982 | Myoshi .............................. | 364/578 |
| 4,385,349 | 5/1983 | Ashford et al. .................. | 364/578 X |
| 4,509,132 | 4/1985 | Kavaya ............................ | 364/578 X |
| 4,554,636 | 11/1985 | Maggi et al. ................... | 364/489 X |
| 4,590,581 | 5/1986 | Widdoes, Jr. ....................... | 364/578 |
| 4,636,967 | 1/1987 | Bhatt et al. ........................ | 364/550 |
| 4,672,529 | 6/1987 | Kupersmit ..................... | 364/551 X |

Primary Examiner—Gary V. Harkcom
Assistant Examiner—H. R. Herndon
Attorney, Agent, or Firm—Burns, Doane, Swecker & Mathis

[57] ABSTRACT

A simulation method and a computer therefor, i.e., a simulator, for simulating operation of a circuit employing logic gates. The simulation method is to be called the event drive method, in which the output processing is executed only when an input to cause output changes and the output level and the start and finish time for the level are sent out. Hence the number of packets of data flowing for simulation can be minimized and also the number of times of data processing is reduced. This system is applied to each component in a logic circuit, whereby the parallel execution of processing as to the parallel components is possible so as to devise the simulation at a higher speed.

7 Claims, 6 Drawing Sheets

FIG. 3

| SELECTION CODE | START TIME | FINISH TIME | SIGNAL LEVEL | ADDRESS FOR LOGIC CIRCUIT COMPONENT INFORMATION | INPUT TERMINAL NUMBER |
|---|---|---|---|---|---|

FIG. 4

| COMPUTATION CODE |
|---|
| NUMBER OF INPUT TERMINAL (Ni) |
| NUMBER OF OUTPUT TERMINAL (No) |
| DOMINANT INPUT AT INPUT TERMINAL 1 |
| DOMINANT INPUT AT INPUT TERMINAL 2 |
| ⋮ |
| DOMINANT INPUT AT INPUT TERMINAL Ni |
| CONNECTION INFORMATION ADDRESS AT OUTPUT TERMINAL 1 |
| CONNECTION INFORMATION ADDRESS AT OUTPUT TERMINAL 2 |
| ⋮ |
| CONNECTION INFORMATION ADDRESS AT OUTPUT TERMINAL No |

Rows 4–6 braced as Ni; rows 7–9 braced as No.

| SELECTION CODE | START TIME | FINISH TIME | SIGNAL LEVEL | CONNECTION INFORMATION ADDRESS |
|---|---|---|---|---|

LOGIC SIMULATION SYSTEM

BACKGROUND OF THE INVENTION

1. Field of the Invention

The present invention relates to a logic simulation system, in other words, a logic simulation method which previously simulates the circuit operation by a computer when a circuit using logic gates is designed, and to a computer, i.e., a simulator which is used for practical use of the logic simulation method.

2. Description of the Prior Art

Since a circuit comprising many logic circuit components, such as logic gates, is often designed at a very complex level, it is troublesome to check the circuit operation by an actual circuit. Hence, prior to construction of the actual circuit, the operation is often presimulated and checked by the computer. A logic simulator is a tool to confirm whether or not an input and an output of signal is proper after carrying out the simulation.

The conventional logic simulator determines the output of each logic circuit component by inspecting the input for a predetermined period to compute the output, so that the result of computation, as it is or only in a case of changing the output content, has been given to the sequential components.

Such logic simulation, however, is larger in a processing load and requires longer latency, whereby the simulation at a high speed has been limited.

OBJECTS OF THE INVENTION

In the light of the above matter, the present invention has been designed.

A first object thereof is to provide a logic simulation method and a logic simulator, which reduce the times of computation to lighten the load on the computing circuit and devise the logic simulation at a high speed.

A second object of the invention is to provide a logic simulation method and a logic simulator, which can minimize the number of packets to reduce the load on the computing circuit and also devise the logic simulation at a high speed.

A third object of the invention is to provide a logic simulation method and a logic simulator, which can carry out the parallel processing as to the parallel logical circuit components and are operable at a high speed.

A fourth object of the invention is to provide a logic simulation method and a logic simulator, which, when a dominant input is introduced, outputs signals without the input of other data to reduce the latency to thereby devise the logic simulation at a high speed.

A fifth object of the invention is to provide a logic simulation method and a logic simulator, which are easy to add a delay time thereto.

The above and further objects and features of the invention will more fully be apparent from the following detailed description with reference to accompanying drawings.

BRIEF DESCRIPTION OF THE DRAWINGS

FIG. 3 shows a format of a transition information packet, FIG. 4 shows the content of the logic circuit component information.

DETAILED DESCRIPTION OF THE INVENTION

Firstly, the logic simulation method of the invention will be explained in summary. The method is to be called the event drive method, which executes the output processing only when an input to change an output is introduced, and sends out the output level and the duration thereof.

In other words, the input information for each logic circuit component is used as the signal level (including high impedance and uncertainty as well as the binary level) and the start and finish time for the level and each input is computed every time to examine possibility of change in the output level, so that only when the output level changes, the output level and the duration thereof (or the start time and the finish time) are given to the sequential component, thereby expecting a decrease in the times of computation.

Next, the present invention will be explained concretely by the drawings.

Figure 1:
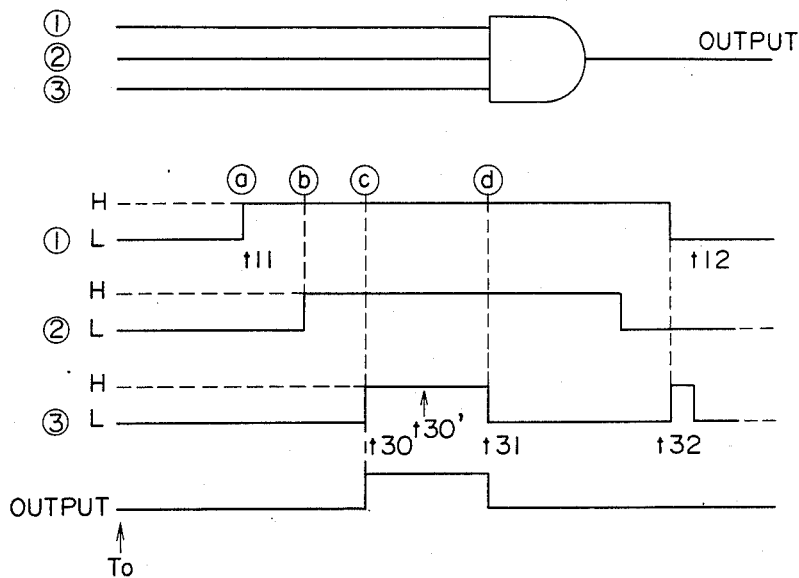
FIG. 1 is an illustration of the principle of the present invention.

As shown in FIG. 1, for an AND gate of three inputs ①, ② and ③, the logic simulation method of the invention computes the outputs at the points a, b, c and d when the input signals ①, ② and ③ rise or the same ③ falls, so that the computed output, only at the time of the points c and d when the output changes, is sent out to the sequential logic circuit components (AND, NAND, OR and NOR gates, buffers, inverters, 3 state buffers or flip-flops). Conventionally, the output is computed for the predetermined cycle period short enough to be compared with the time period from the signal changing time to the next signal changing time regardless of existence of change in the input signals ①, ② and ③.

In the logic simulation method of the invention, the input signals ①, ② and ③ are not actually used, but used as the signal information (transition information) to be introduced in the AND gate shown in FIG. 1, and the signal level and the start time and the finish time therefor are given. For example, the high level portion at the input ① has the signal level H, the level start time $t_{11}$ and the level finish time $t_{12}$ and the low level portion at the input ③ has L, $t_{31}$ and $t_{32}$ respectively. The portion for computing the output of the AND gate, computes the output every time when the level changes in accordance with the transition information given in such state. As a result, when the output changes in comparison with the present output, the required output processing is carried out.

FIG. 1 shows a state where all the input signals are given, but in each logic circuit component, all the inputs are not always completely developed in the state where the output computation is possible. The output is computed in principle after all the inputs are developed.

However, in the case that the dominant input, such as the high level input at an OR gate, which can determine the output without depending on the other input information, is given, the output is computed to be determined to an extent of the duration wherein the dominant input to decided, in which all the inputs are not waited to be developed.

Next, concrete explanation will be given on an embodiment of the logic simulator of the invention.

Figure 2:
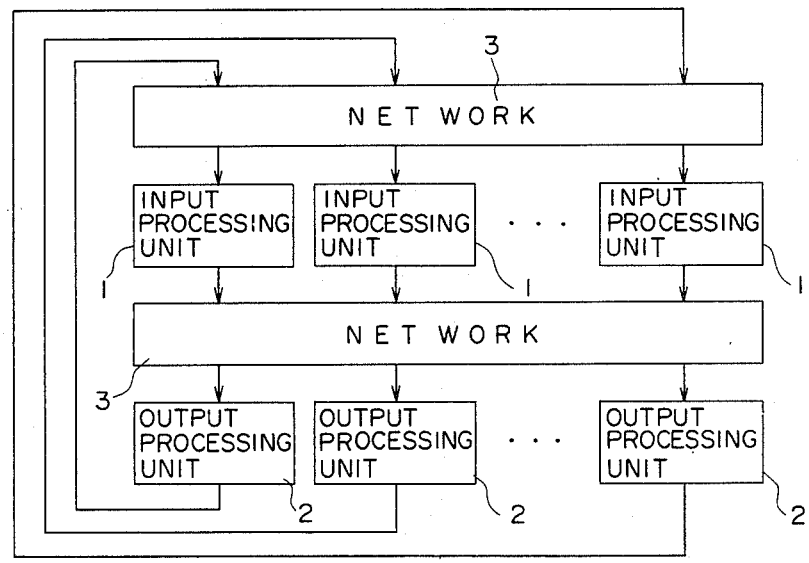
FIG. 2 is a block diagram of an embodiment of a logic simulator of the invention.

FIG. 2 shows the general construction of the logic simulator of the invention, in which a plurality of input processing units 1,1 . . . for computing the outputs on the basis of the inputs to the logic circuit component and a plurality of output processing units 2,2 . . . for distributing to the input processing units 1,1 . . . the computed outputs as they are or subjected to the necessary computation so as to carry out computation of the sequential logic circuit component, are connected with each other by network 3 so that data can desirably transmitted and received between the input and output processing units 1,1 . . . and 2,2 . . . .

Figures 5, 6, 7:
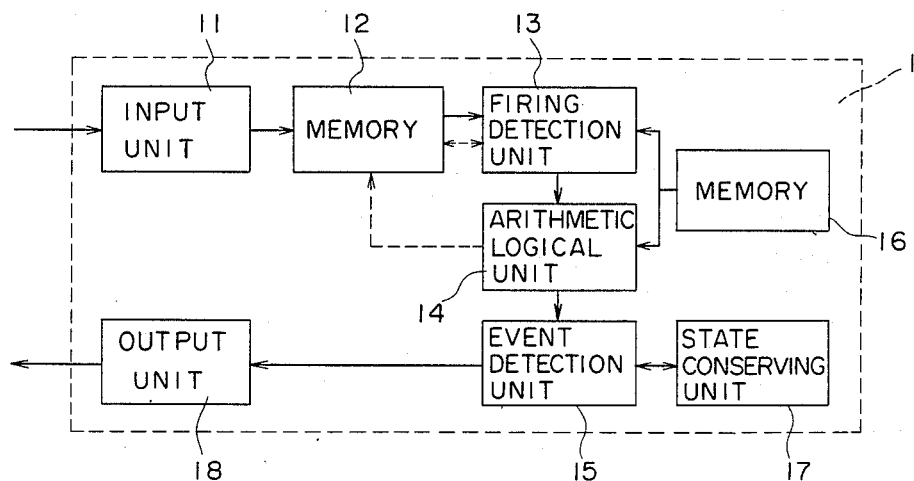
FIG. 5 shows a format of an event information packet.
FIG. 6 shows the content of the connection information.
FIG. 7 is a block diagram of an input processing unit.

A packet of transition information having the format as shown in FIG. 3 is introduced to the input processing unit 1 from the network 3 or the output processing units 2,2 . . . , and a packet of the event information having the format as shown in FIG. 5 is introduced to the output processing units 2,2 . . . from the input processing units 1,1 . . . respectively, the aforesaid transition information or the event information being fetched when necessary from the network 3.

Next, explanation will at first be given on the transition information. The packet comprises a selection code for specifying the input processing unit 1 to be the destination of the packet, the signal level, the start time and the finish time for the signal level, address of a memory 16 (to be discussed below) for storing the information as to the logic circuit components to give the signals displayed by the start time and finish time for the level, and input terminal numbers in the components.

FIG. 4 shows the content of the information as to one of the logic circuit components, the information comprising a computation code (the code of displaying the kind of components, such as the AND gate or the OR gate, or of computation), the number of the input terminals (Ni) of the components, the number of the output terminals of the same, the existence of the dominant input and the level thereof as to the respective input terminals 1 to Ni, and the connection information address as to the respective output terminals 1 to No.

Next, explanation will be given on the packet of the event information shown in FIG. 5. The packet comprises a selection code to specify the output processing unit 2 to be the destination of the packet, the level of the output signal, the start time and the finish time for the level, and address of a memory 23 (to be discussed below) storing therein the connection information regarding the address of the packet.

FIG. 6 shows the content of the connection information corresponding to one outuput, the information comprising the number of fan-outs (Nf), an address to specify the logic circuit component to be the address of the output as to the Nf of fanouts, and an input-terminal number of the corresponding component.

FIG. 7 is a block diagram of the input processing unit 1. The transition information packets of the contents as shown in FIGS. 3 and 4 are distributed through the network 3 to the input processing unit 1 corresponding to the selection code and stored in a memory 12 through an input unit 11 serving as to the interface with respect to the network 3 on the input side. The memory 12 queues and stores the data (level, and the start time and the finish time) of many logic circuit components allocated to the input processing unit 1 until all the inputs of the respective components are completely developed or the dominant input is given. The storage is formed to have the queue in a list form at every component and input terminal. The memory 16 stores the logic circuit component information, that is, the dominant input at the input terminal and the connection information address of the output terminal. The logic circuit component information stored in the memory 16 represents the logic circuit of the object for simulation together with the connection information from a memory 23 at the output processing unit 2, thereby being allocated to each memory prior to the execution of simulation.

A firing detection unit 13 reads out the contents of memory 12 as occasion requires and carries out firing detection to decide whether or not the computation processing is possible to complete all the inputs, or the dominant input is given. When the computation processing is possible, the firing detection unit 13 gives a notice of this to an arithmetic logical unit 14 and lets it carry out the computation processing. This computation processing decides the output level from a certain time to another. For instance, in an example in FIG. 1, assuming that the information of ① and ② are already given and that of ③ is given to $t_{30}$ (at the time of the point c), the AND gate enables computation for the duration of $T_0$ to $t_{30}$. The arithmetic logical unit 14 sends out to an event detection unit 15 the computation result, that is, the output level of the component and the start time and the finish time for the level, the information after used is erased from the memory 12.

The event detection unit 15 detects whether or not the event is created, in other words, whether or not the output computed with respect to the former output changes. The former output, in other words, the level of signal, which is output previously from the event detection unit 15 to the output processing unit 2 through an output unit 18, is stored in a state conserving unit 17. The event detection unit 15 compares the output from the arithmetic logical unit 14 with the content of the state conserving unit 17, so that when both are identical with each other, any output is not developed assuming that no event is created. On the contrary, when both the levels are different, the event information in the format in FIG. 5 is output to the output processing unit 2 through the output unit 18 of the interface between the event detection unit 15 and the network 3 on the output side. The event information is a combination of the signal level resulting from the computation by the arithmetic logical unit 14, the start time and the finish time for the level, the selection code based on the content of the memory 16, and address of the memory 23 storing therein the connection information.

Figure 8:
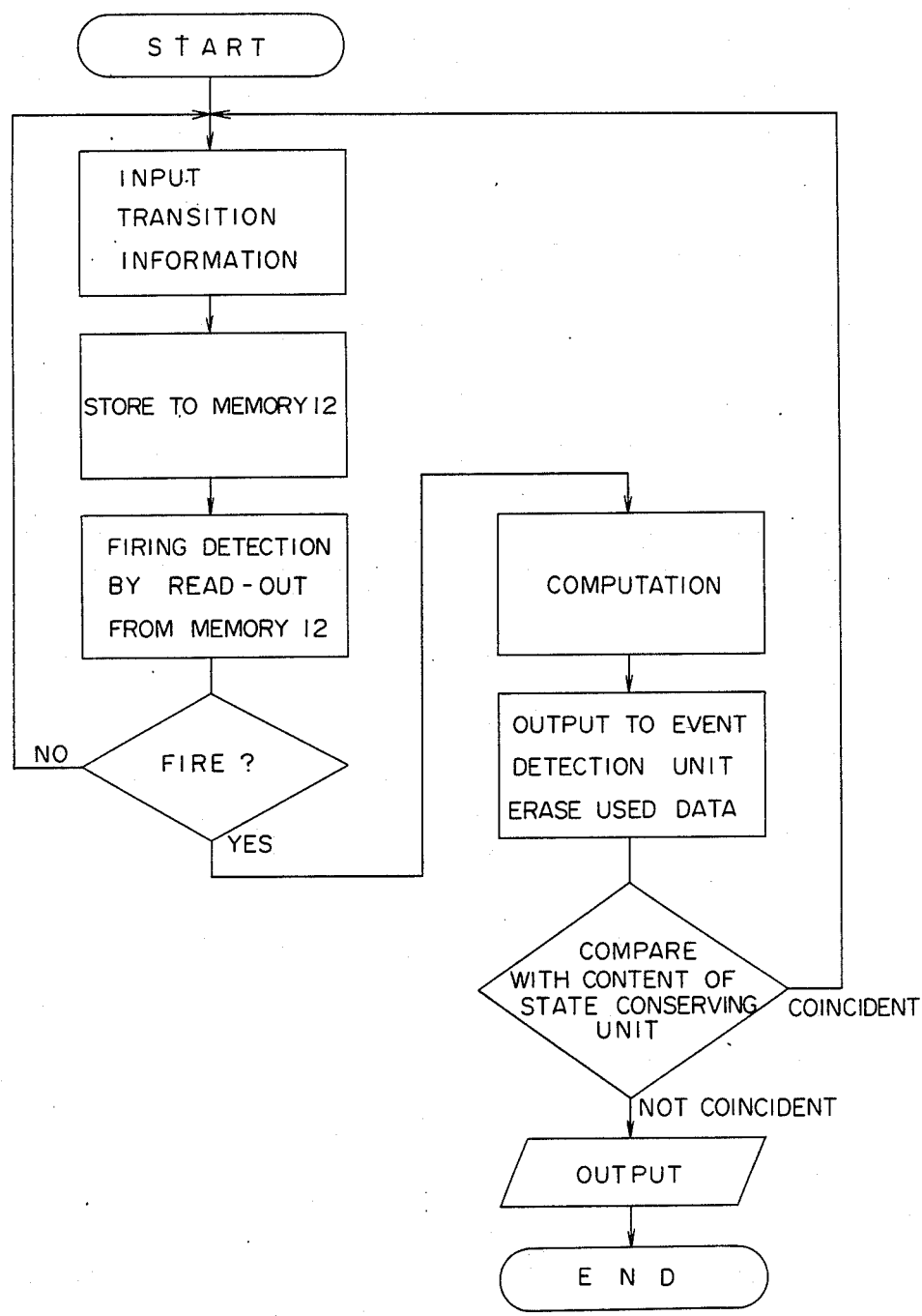
FIG. 8 is a flow chart of the operation content of the input processing unit.

FIG. 8 is a flow chart showing the content of the abovementioned operation of the input processing unit 1.

Figure 9:
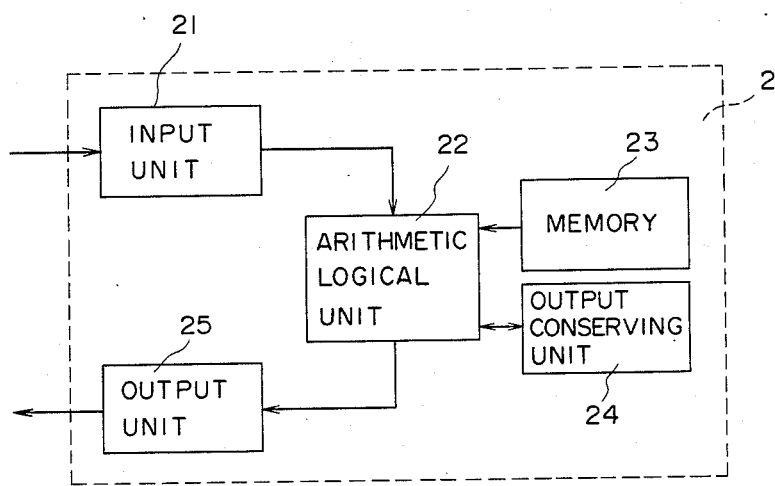
FIG. 9 is a block diagram of an output processing unit.

FIG. 9 is a block diagram showing construction of the output processing unit 2, in which the event information is given to the arithmetic logical unit 22 through an input 21 of the interface to the network 3 on the input side, where the event information is converted into the transition information to be delivered to the predetermined input processing unit 1 through an output unit 25 of the interface to the network 3 on the output side.

The memory 23 stores therein the connection information to specify the sequential logic circuit component to be given the transition information. The output conserving unit 24 stores therein the content of the event information previously introduced into the output processing units 2,2 . . . .

The arithmetic logical unit 22 makes the transition information on the basis of the input event information. The event information, as abovementioned, is output when the output of the logic circuit component changes, where the finish time of the new output level is temporary. In other words, assuming that the data 3 in the FIG. 1 example is given to the time of $t_{30}$, between the points c and d, the output level at the point c changes from the low to the high level to thereby output the event information. The finish time for this level is defined until $t_{30'}$, which is introduced into the output procesing unit 2. Thereafter, when the data of 3 after the point d or $t_{31}$ is given to the input processing unit 1 and the event information following the level changes from high to low at the time d is generated, the finish time of the period wherein the output of AND gate has a high level, is redefined as $t_{31}$. The arithmetic logical unit 22 defines the finish time, in other words, makes the transition information, by means of the event information newly introduced and that stored in the output conserving unit 24 and previously introduced, and then sends out the made transition information to the input processing unit 1.

Figure 10:
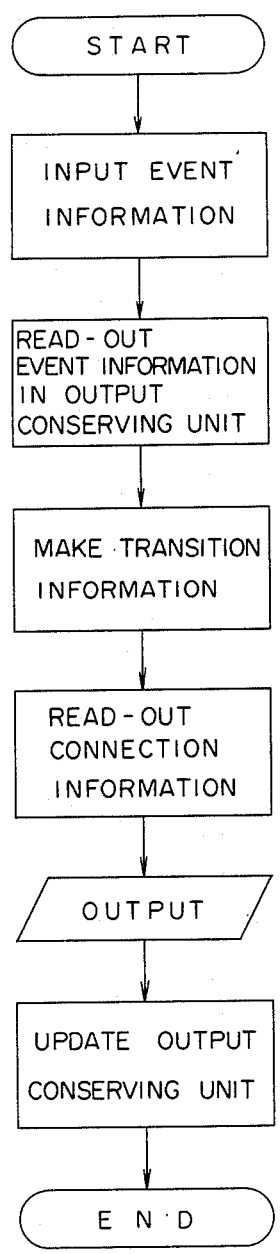
FIG. 10 is a flow chart of the processing content of the computing unit.

FIG. 10 is a flow chart showing the content of processing by the arithmetic logical unit 22.

In addition, the arithmetic logical unit 22 can be constructed not only to make the finish time as aforesaid but also to carry out the adding processing for a delay time. In other words, a delay (such as gate delay) of each logic circuit component or a delay in wiring can be added herewith and then given to the sequential component.

As seen from the above, the aforesaid logic simulation method or the logic simulator, is adapted to develop the output by the event drive method as to each logic circuit component, thereby enabling the parallel execution of processing for the parallel components. Moreover, since the output is developed only when the output of each component changes, the number of packets flowing in the order of the input processing unit, the output processing unit, the input processing unit and so forth, is reducible to the minimum requirement, and also the computation is carried out only when the signal changes, whereby the times of data processing are largely reduced and the logic simulation at a high speed can be expected. Furthermore, when there is the dominant input, the logic simulator outputs the signal without an input of other data so as to reduce the latency, thereby further devising the logic simulation at a higher speed. In addition, the delay time is easy to add.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within meets and bounds of the claims, or equivalence of such meets and bounds thereof are therefore intended to be embraced by the claims.

What is claimed is:

1. A simulator for verifying an operation of a logic circuit which comprises a plurality of components wherein each component receives at least one changeable input signal and responsively transmits a changeable output signal to at least one other component, the changeable output signal being determined in response to the at least one input signal, the simulator comprising:

first processing means for computing the changeable output signals, the first processing means comprising:

memory means for selectively storing the changeable signals corresponding to at least one of the components of the logic circuit and for storing logic circuit component information representing the at least one component;

means for detecting at least one of when the at least one input signal determining the output signal of the at least one component is stored in the memory means and when all input signals to the at least one component are stored in the memory means;

arithmetic logic means for computing the output signal of the at least one component from the changeable signals stored in the memory means, wherein the arithmetic logic means computes the output signal responsively to the detecting means;

event detection means for comparing the output signal computed by the arithmetic logic means with a prior output signal computed by the arithmetic logic means and for outputting an event signal when the output signal is different from the prior output signal, wherein the event signal includes the output signal, a start time of the output signal and a stop time of the output signal, the output signal being constant at least until the stop time; and second processing means for computing a transition signal in response to the event signal, and for outputting the transition signal to the first processing means, wherein the transition signal includes the stop time of the prior output signal corresponding to the event signal and is output as an input signal corresponding to a subsequent step in the operation of the logic circuit to the first processing means.

2. The simulator of claim 1, wherein the second processing means includes means for adding a predetermined delay time to the stop time and the start time of the transition signal.

3. The simulator of claim 1, wherein the memory means stores the changeable signals and logic circuit component information for a plurality of components.

4. The simulator of claim 1, further including a plurality of first processing means and a plurality of second processing means, wherein transition signals are computed by the plurality of second processing means in response to event signals from the plurality of first processing means and are output to at least one of the plurality of first processing means.

5. The simulator of claim 4, wherein each of the plurality of second processing means includes means for adding a predetermined delay time to the stop time and the start time of the transition signal.

6. The simulator of claim 4, wherein each memory means stores the changeable signals and logic circuit component information for a plurality of components.

7. A simulation method for verifying operation of a logic circuit comprising a plurality of components, each of said plurality of components receiving an input signal and generating an output signal at least partially on the basis of said input signal, comprising the steps in order of:

(a) generating a first packet of binary digital data including a plurality of bits indicative of a start time when a binary level of said input signal changes from a first input level to a new input level, at least one bit indicative of said new input level, and a plurality of bits indicative of a stop time later than said start time when the binary level of the input signal changes from said new input level;

(b) determining, based on said first packet generated in said step (a) and a set of predefined characteristics of a given one of said plurality of components, whether a preestablished output level of said output signal would undergo a change to a new output level when said binary level of said input signal changes; and (c) only if said determining step (b) yields an affirmative result, generating a second packet of binary digital data including a plurality of bits indicative of a start time when said level of said output signal changes from said preestablished output level to said new output level, at least one bit defining said new output level, and a plurality of bits defining a stop time when said level of said output signal changes from said new output level.

* * * * *

UNITED STATES PATENT AND TRADEMARK OFFICE
CERTIFICATE OF CORRECTION

PATENT NO.   :   4,775,950

DATED        :   October 4, 1988

INVENTOR(S)  :   Hiroaki Terada et al

It is certified that error appears in the above-identified patent and that said Letters Patent is hereby corrected as shown below:

On the Title Page, Item [73],
Please change the name of the assignee to read:

--Sanyo Electric Co., Ltd., Osaka, Japan
Matsushita Electric Industrial Co., Ltd., Osaka Japan
Sharp Kabushiki Kaisha, Osaka, Japan and
Mitsubishi Denki Kabushiki Kaisha, Tokyo, Japan --

Signed and Sealed this

Thirteenth Day of June, 1989

*Attest:*

DONALD J. QUIGG

*Attesting Officer*       *Commissioner of Patents and Trademarks*